US010645207B2

(12) United States Patent
Kasemsadeh et al.

(10) Patent No.: US 10,645,207 B2
(45) Date of Patent: May 5, 2020

(54) TOUCH BUTTON STRUCTURE INTEGRATED INTO AN EDGE PANEL OF A PORTABLE COMPUTING/COMMUNICATIONS DEVICE

(71) Applicant: TEXAS INSTRUMENTS INCORPORATED, Dallas, TX (US)

(72) Inventors: Benjamin S Kasemsadeh, San Jose, CA (US); James R Catt, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/169,685

(22) Filed: May 31, 2016

(65) Prior Publication Data

US 2016/0349805 A1 Dec. 1, 2016

Related U.S. Application Data

(60) Provisional application No. 62/167,402, filed on May 28, 2015.

(51) Int. Cl.
*H04M 1/23* (2006.01)
*G06F 1/16* (2006.01)
(Continued)

(52) U.S. Cl.
CPC .......... *H04M 1/236* (2013.01); *G06F 1/1626* (2013.01); *G06F 1/1671* (2013.01); *H03K 17/97* (2013.01); *H03K 17/975* (2013.01)

(58) Field of Classification Search
CPC ...... G06F 1/182; G06F 1/1656; G06F 1/1671; G06F 1/1626; H04M 1/236; H03K 17/97; H03K 17/975
See application file for complete search history.

(56) References Cited

U.S. PATENT DOCUMENTS

2007/0236450 A1* 10/2007 Colgate .................. G06F 3/016
345/156
2009/0270141 A1* 10/2009 Sassi ................... G06F 3/03547
455/575.1
(Continued)

OTHER PUBLICATIONS

Curtis et al. mTouch™ Metal Over Cap Technology (Application note AN1325). Jan. 5, 2010. Retrieved from Microchip's website: http://ww1.microchip.com/downloads/en/AppNotes/01325A.pdf.*

*Primary Examiner* — Abhiskek M Rathod
(74) *Attorney, Agent, or Firm* — John R. Pessetto; Charles A. Brill; Frank D. Cimino

(57) ABSTRACT

A device such as a portable computing/communications device is configured with slotted touch-on-metal buttons integrated into an edge panel. A ToM button structure includes a structural fascia integrated into the edge panel, defining a touch-button area including a touch-button length. The structural fascia is slotted, with alternating sections that are respectively relatively-thinner and relatively-thicker. The ToM button can be integrated into curved for flat edge panels. Button-press detection can be based on, for example, either inductive and capacitive deformation sensing. The ToM button structure can be configured for a predetermined button-press deformation based on a defined touch-button length, defined slotting difference between the relatively-thinner sections and the relatively-thicker sections and a defined deformation pressure.

17 Claims, 7 Drawing Sheets

(51) Int. Cl.
*H03K 17/97* (2006.01)
*H03K 17/975* (2006.01)

(56) References Cited

U.S. PATENT DOCUMENTS

| | | | | |
|---|---|---|---|---|
| 2014/0118905 A1* | 5/2014 | Chung | ............... | A45C 11/00 |
| | | | | 361/679.01 |
| 2014/0176159 A1* | 6/2014 | Pintiliuc | ............. | H03K 17/97 |
| | | | | 324/655 |
| 2014/0267152 A1* | 9/2014 | Curtis | ............... | G06F 3/0414 |
| | | | | 345/174 |

* cited by examiner

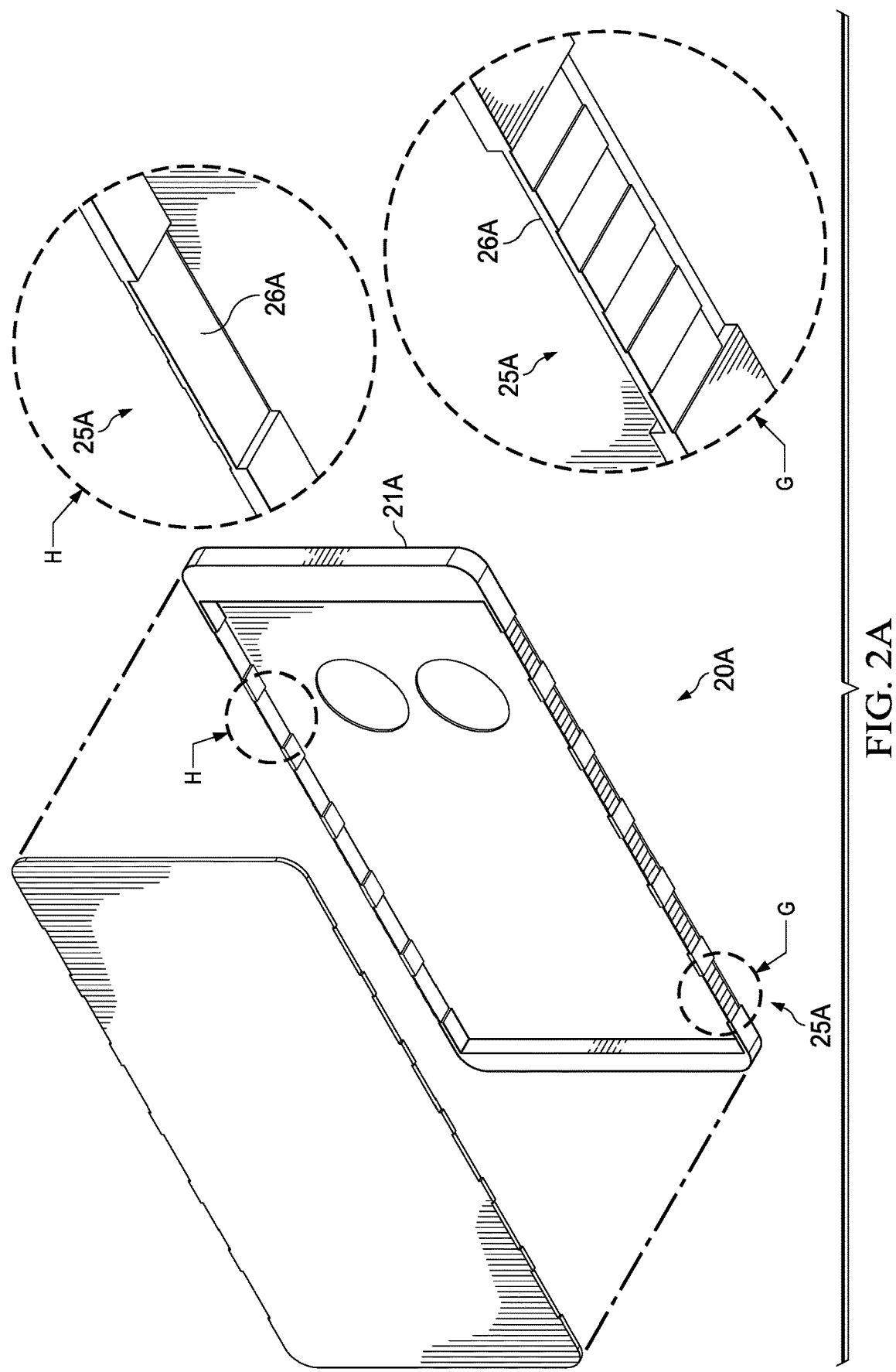

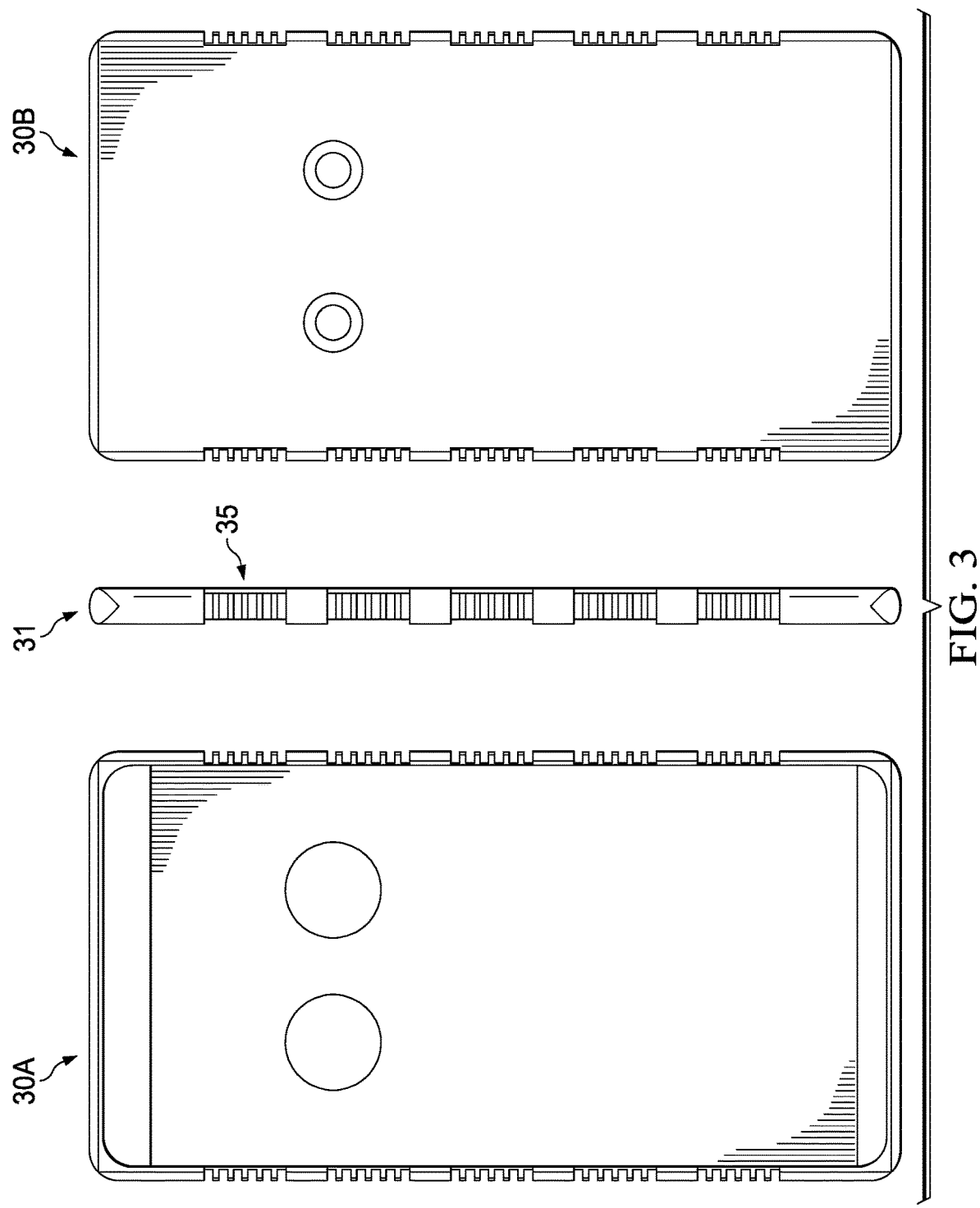

TOUCH BUTTON STRUCTURE INTEGRATED INTO AN EDGE PANEL OF A PORTABLE COMPUTING/COMMUNICATIONS DEVICE

CROSS-REFERENCE TO RELATED APPLICATIONS

Priority is claimed under 37 CFR 1.78 and 35 USC 119(e) to U.S. Provisional Application 62/167,402, filed 28 May 2015), which is incorporated by reference.

BACKGROUND

Technical Field

This Patent Disclosure This Provisional Patent Disclosure relates to touch-on-metal (ToM) input structures, such as for ToM buttons or keys such as for integration into personal computing/communication devices.

Related Art

Portable/personal computing/communications devices typically include mechanical touch buttons integrated into the case. Such mechanical touch buttons are distinguished from, for example capacitive touch buttons defined on a screen.

These mechanical touch buttons are commonly located on a case edge, but also can be located on a bezel area of the screen surface, or on the back surface.

While this Background information references portable communication/computing devices, the Disclosure in this Patent Document is more generally directed to ToM input structures.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for touch-on-metal (ToM) input to a device using slotted ToM button/key structures integrated into an edge panel of the device, such as a portable/personal computing/communications device.

According to aspects of the Disclosure, a method of providing ToM input to a device includes forming at least one edge panel of the device with an integrated slotted ToM button. A ToM button according to the Disclosure includes a slotted structural fascia defining a touch-button area including a touch-button length, where the slotted structural fascia formed with alternating sections that are respectively relatively-thinner and relatively-thicker.

In other aspects of the Disclosure, the edge panels, and the ToM buttons, can be curved or flat. Button-press detection can be based on one of inductive and capacitive deformation sensing.

In other aspects of the Disclosure, ToM button structures are formed by configuring the ToM button structure for a predetermined button-press deformation based on a defined touch-button length, defined slotting difference between the relatively-thinner sections and the relatively-thicker sections and a defined deformation pressure.

Other aspects and features of the invention claimed in this Patent Document will be apparent to those skilled in the art from the following Disclosure.

BRIEF DESCRIPTION OF THE DRAWINGS

FIG. 1A is an interior view 10A of the case, with curved edge panels 11A including integrated ToM button structures 15A, and FIG. 1B is an exterior view 10B of the case with curved edge panels 11B including integrated ToM button structures 15B, the ToM button structures slotted according to aspects of this Disclosure.

FIGS. 2A and 2B illustrate an example embodiment of a slotted ToM button structure integrated into a flat edge panel of a portable communications device: FIG. 2A is an interior view 20A of the case, with flat edge panels 21A including integrated ToM button structures 25A, and FIG. 2B is an exterior view 20B of the case with curved edge panels 21B including integrated ToM button structures 25B, the ToM button structures slotted according to aspects of this Disclosure.

FIGS. 3 and 4 illustrate a design examples of portable communications devices with slotted ToM button structures integrated into edge panels, including example dimensioning: FIG. 3 illustrates example dimensioning for a personal communications device with curved edge panels and curved slotted ToM button structures, and FIG. 4 illustrates example dimensioning for a personal communications device with flat edge panels and flat slotted ToM button structures.

DETAILED DESCRIPTION

This Description and the Drawings constitute a Disclosure for slotted touch-on-metal (ToM) button structures that can integrated into devices, such as the edge panels of a portable computing/communications devices, including describing example embodiments, and illustrating various technical features and advantages.

In brief overview, a device such as a portable computing/communications device, can be configured with slotted touch-on-metal buttons integrated into an edge panel, according to aspects of this Disclosure. A ToM button structure includes a structural fascia integrated into the edge panel, defining a touch-button area including a touch-button length. The structural fascia is slotted, with alternating sections that are respectively relatively-thinner and relatively-thicker. The ToM button can be integrated into curved for flat edge panels. Button-press detection can be based on, for example, either inductive and capacitive deformation sensing. The ToM button structure can be configured for a predetermined button-press deformation based on a defined touch-button length, defined slotting difference between the relatively-thinner sections and the relatively-thicker sections and a defined deformation pressure.

While this Disclosure sets forth example embodiments of slotted ToM button structures integrated into portable/personal communication/computing devices, the Disclosure is applicable for other applications/devices to provide ToM input through ToM buttons or keys.

Figure 1A:
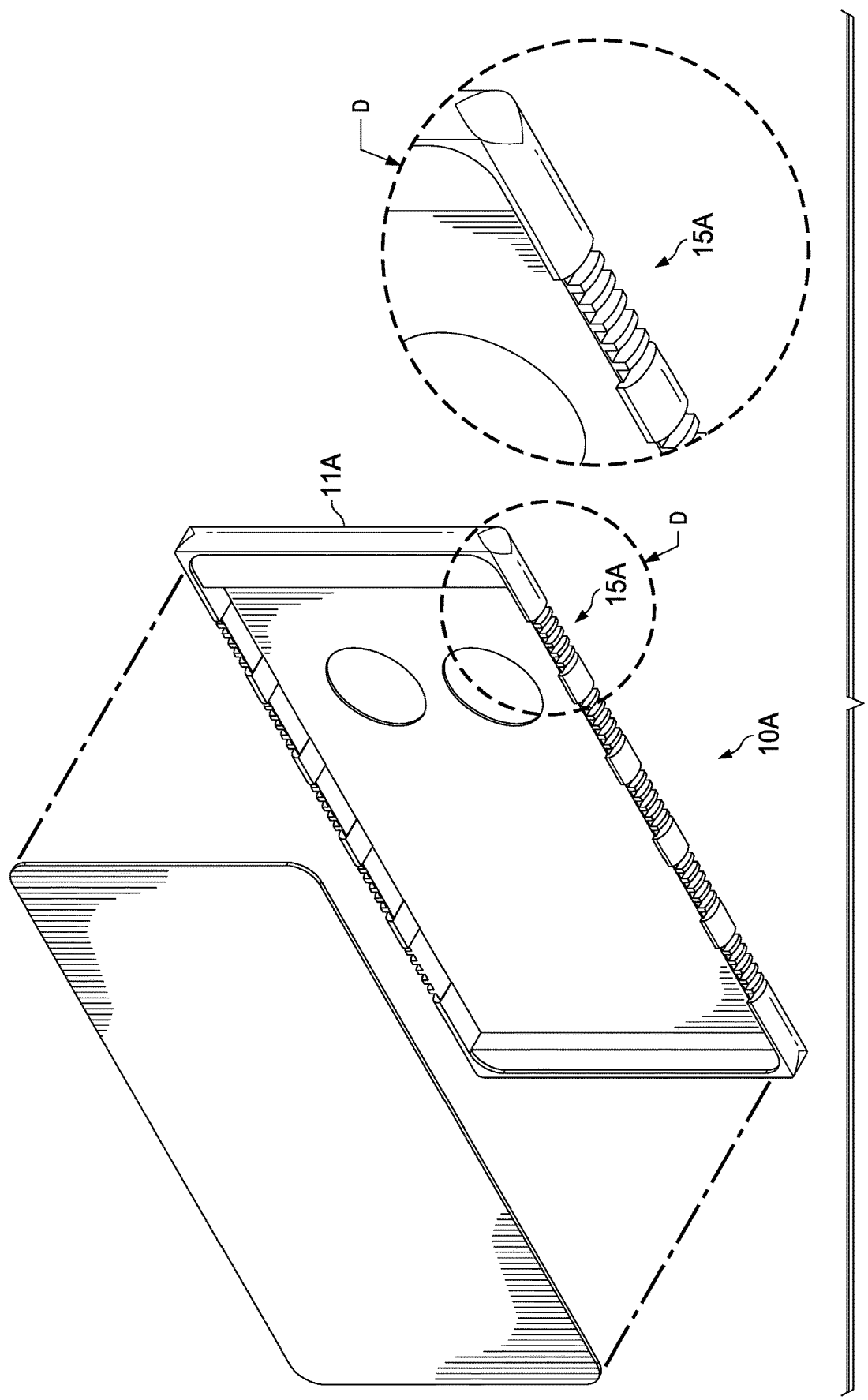
FIGS. 1A and 1B illustrate an example embodiment of a slotted touch-on-metal (ToM) button structure integrated into a curved edge panel of a portable communications device.
Figure 4:
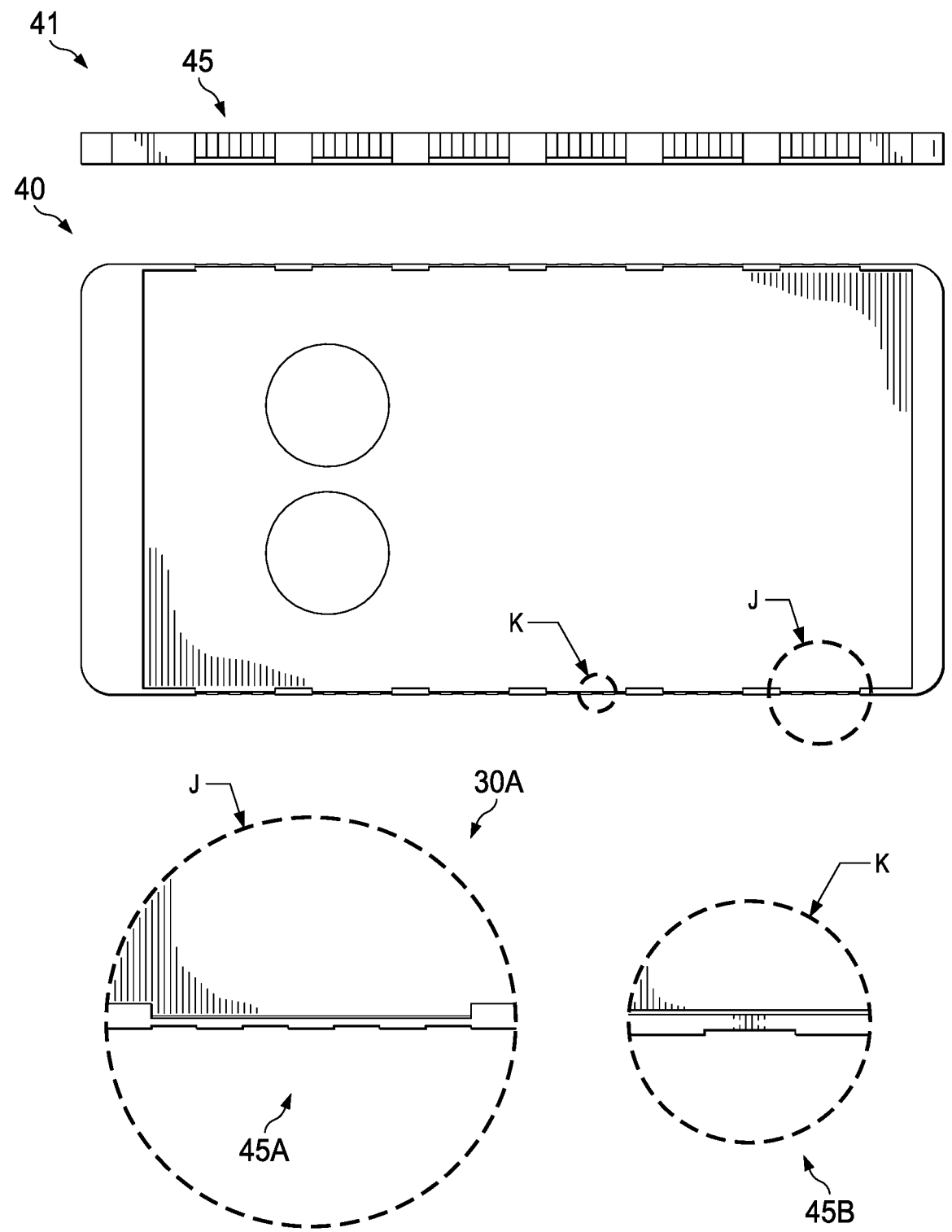
Figure 5A:
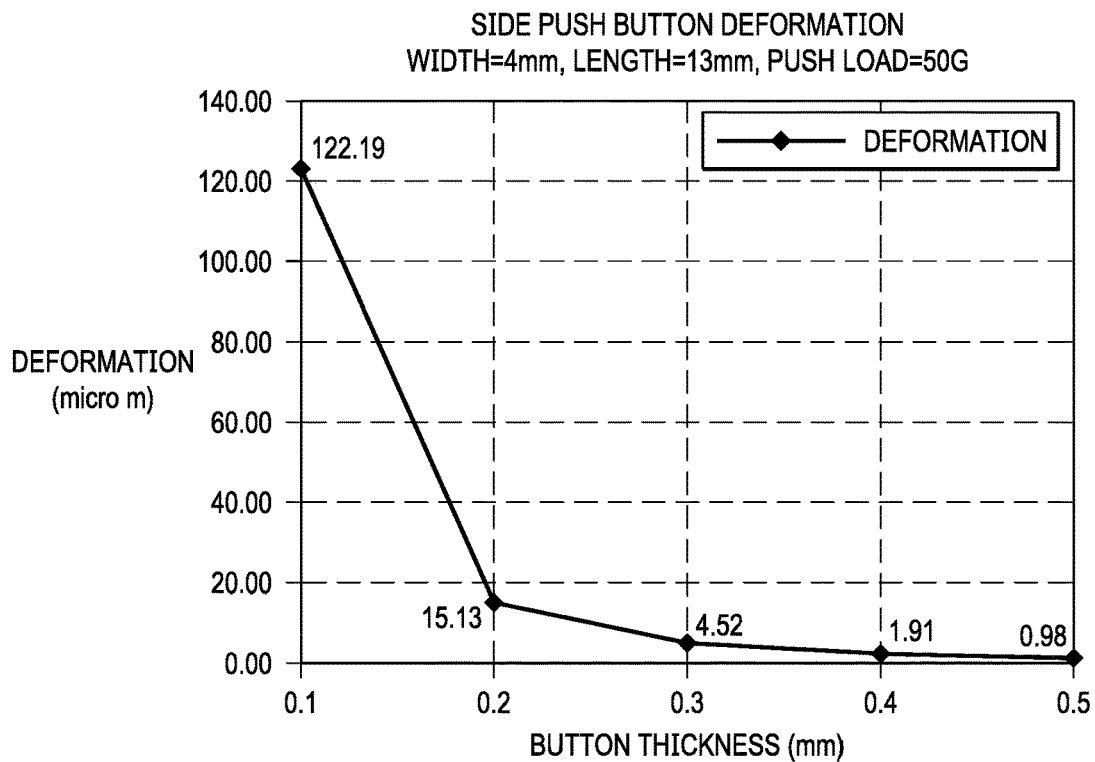
FIGS. 5A and 5B illustrate example plots for side-push deformation of slotted ToM button structures, with example plots for deformation based on respectively button thickness and push load.

FIGS. 1A/1B and FIGS. 2A/2B illustrate example embodiments of slotted ToM button structures integrated into example portable/personal communications with, respectively curved and flat edge panels. FIGS. 3 and 4 illustrate design examples with example dimensioning for, respectively, the devices of FIGS. 1A/1B and 2A/2B with curved/flat edge panels. FIGS. 5A/5B provide example plots for deformation based on respectively button thickness and push load.

According to aspects of the Disclosure, the ToM button structures are implemented with a slotted fascia including alternating sections that are respectively relatively-thinner and relatively-thicker. The slotting difference between relatively-thinner and relatively-thicker sections of the ToM button structure (fascia) can be used to provide a degree of design trade-off (choice) between ToM button length or rigidity, and a defined deformation pressure resulting in detection of a button-press event/condition.

Detection of a button-press event/condition can be based on any sensing technology capable of detecting deformation of the ToM button structure for the particular application and device design, such as inductive or capacitive. Implementations of deformation sensing are not part of this Disclosure, and are not described in detail. For example, inductive sensing can be based on detecting button-press deformation of a slotted ToM structure (fascia), configured as a conductive target, toward a spaced coil inductor, causing a change in coil inductance (i.e., a change in the projected magnetic field of the coil inductor). And, conductive sensing can be based on detecting button-press deformation of a slotted ToM structure (fascia) toward a capacitive electrode, causing a change in projected electric field detected as a change in capacitance.

Figure 1B:
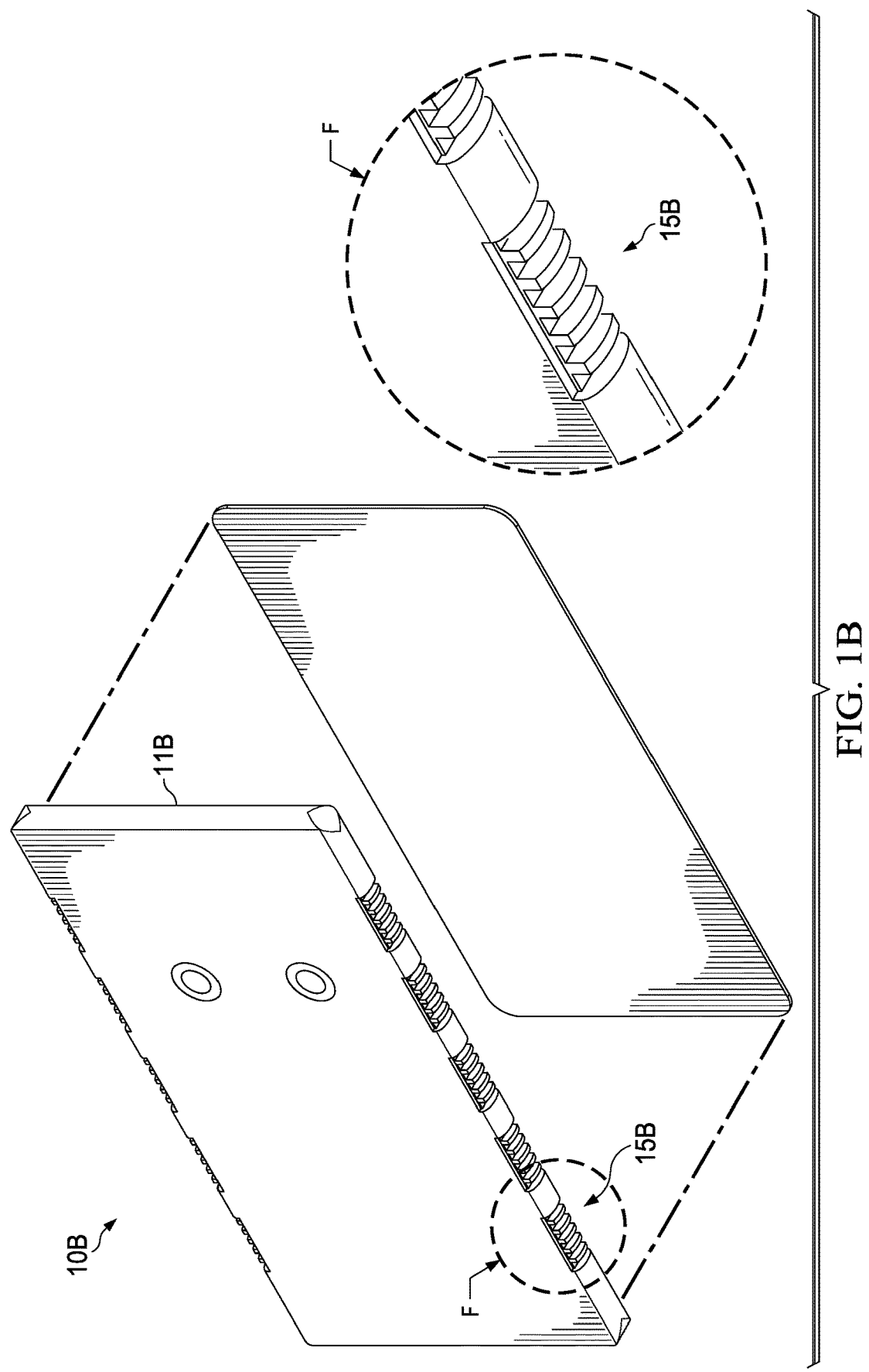

FIGS. 1A and 1B illustrate an example embodiment of a slotted ToM button structure integrated into a curved edge panel of the case of a portable communications device. FIG. 1A is an interior view 10A of the case, and FIG. 1B is an exterior view 10B of the case, with curved edge panels 11A/11B.

Curved edge panels 11A/11B are formed with integrated ToM button structures (fascia) 15A/15B. As evident in the detail views, ToM button structures 15A/15B are slotted according to aspects of this Disclosure.

Figure 2B:
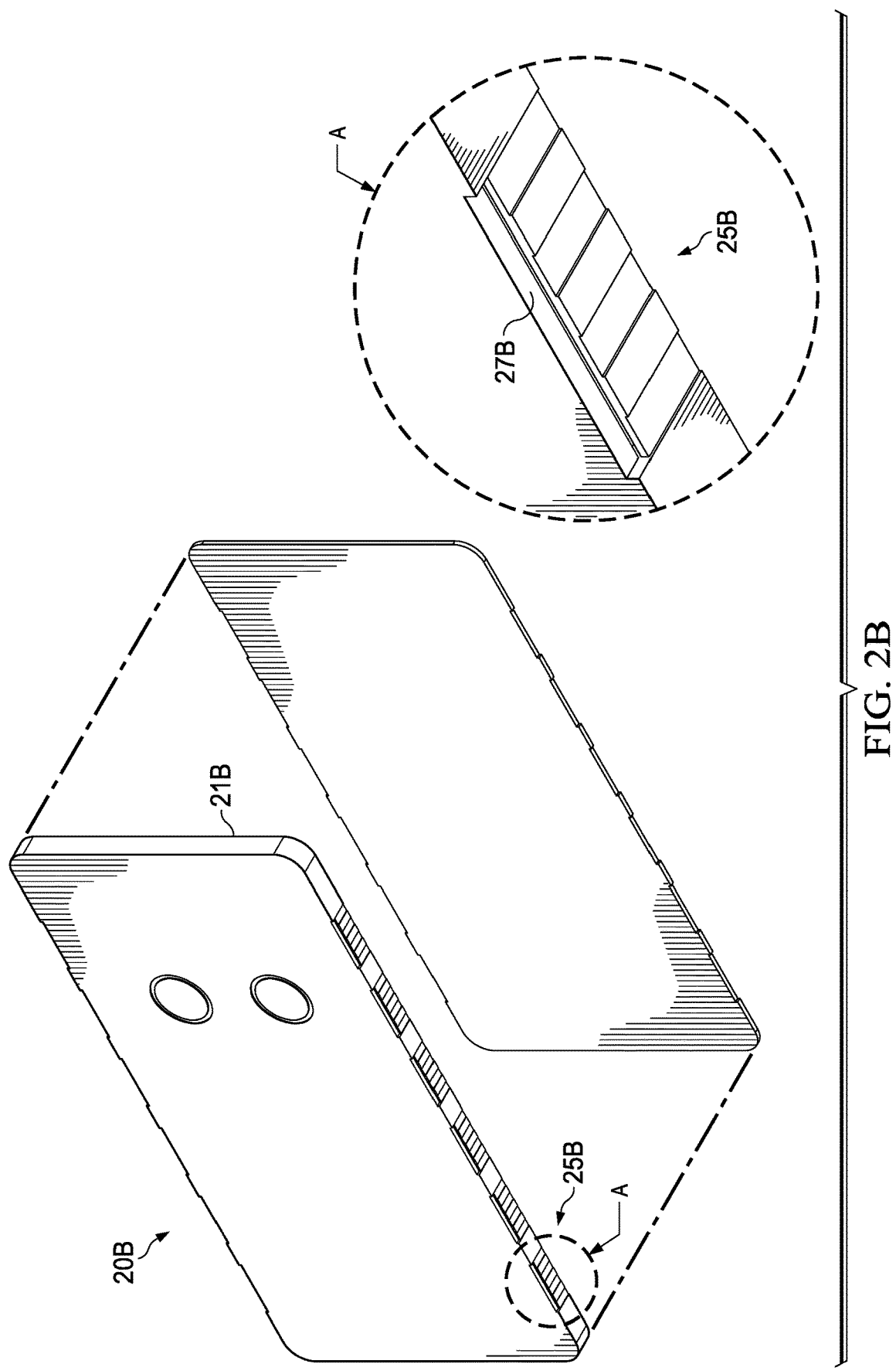

FIGS. 2A and 2B illustrate an example embodiment of a slotted ToM button structure integrated into a flat edge panel of the case of a portable communications device. FIG. 2A is an interior view 20A of the case, and FIG. 2B is an exterior view 20B of the case, with flat edge panels 21A/21B.

Flat edge panels 21A/21B are formed with integrated ToM button structures (fascia) 25A/25B. As evident in the detail views, ToM button structures 25A/25B are slotted according to aspects of this Disclosure.

FIG. 2A includes detail of a ToM button structure including an optional recessed back-plane 26A that reduces overall thickness of the slotted ToM button structure (both relatively-thinner and relatively-thicker alternating sections). FIG. 2B includes detail of an optional length-wise cut-out that reduces overall width of the slotted ToM button structure (again, both relatively-thinner and relatively-thicker sections). These optional configurations provide additional degrees of design trade-off between ToM structural rigidity and size, and a defined deformation pressure resulting in detection of a button-press event/condition.

FIGS. 3 and 4 illustrate design examples of portable communications devices with slotted ToM button structures integrated into edge panels, including example dimensioning. FIG. 3 illustrates example dimensioning for a personal communications device with curved edge panels and curved slotted ToM button structures. FIG. 4 illustrates example dimensioning for a personal communications device with flat edge panels and flat slotted ToM button structures.

Figure 5B:
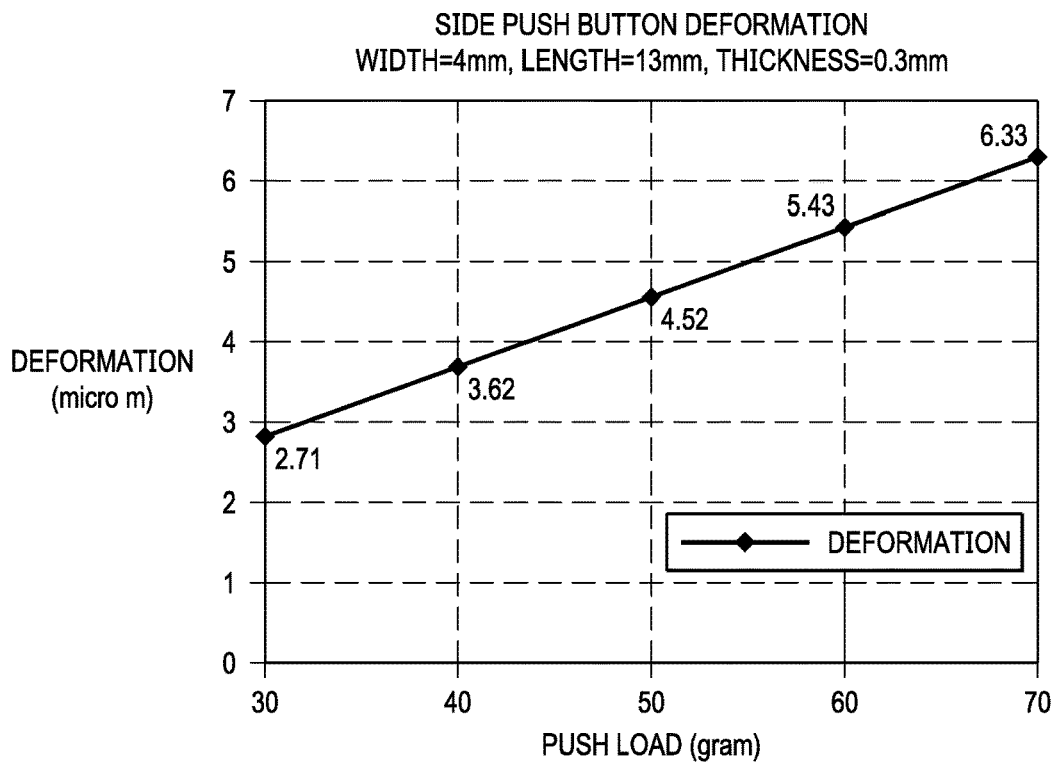

FIGS. 5A and 5B illustrate example plots for side-push deformation of slotted ToM button structures, with example plots for deformation based on respectively button thickness and push load.

The Disclosure provided by this Description and the Figures sets forth example embodiments and applications illustrating aspects and features of the invention, and does not limit the scope of the invention, which is defined by the claims. Known circuits, functions and operations are not described in detail to avoid obscuring the principles and features of the invention. These example embodiments and applications, including example design dimensioning, can be used by ordinarily skilled artisans as a basis for modifications, substitutions and alternatives to construct other embodiments, including adaptations for other applications.

The invention claimed is:

1. An apparatus for touch button input, comprising:
   a case including multiple edge panels;
   a touch button structure integrated into a respective edge panel, with a defined touch-button area including a touch-button length;
   the touch button structure including:
      a deformable base, and
      a structural fascia formed on or attached to the deformable base;
   the deformable base configured for deformation from a button-press of the structural fascia;
   the structural fascia slotted to control deformation pressure for deformation of the deformable base, with alternating sections that are respectively relatively-thinner and relatively-thicker.

2. The apparatus of claim 1, wherein the apparatus is one of a personal communications device and a personal computing device.

3. The apparatus of claim 1, wherein the respective edge panel, and the touch button structure, including an outer surface of the structural fascia, are curved.

4. The apparatus of claim 1, wherein the respective edge panel, and the touch button structure, including an outer surface of the structural fascia, are flat.

5. The apparatus of claim 1, wherein button-press detection is based on one of inductive and capacitive sensing of deformation of the deformable base.

6. The apparatus of claim 1, wherein the touch button structure is configured for a predetermined button-press deformation based on a defined touch-button length, a defined deformability of the deformable base, and a defined slotting difference between the relatively-thinner sections and the relatively-thicker sections.

7. A personal communications device including a case with front and back sides, and four edge panels, and including one or more touch button input structures, comprising:
   a touch button structure integrated into a respective edge panel, with a defined touch-button area including a touch-button length;
   the touch button structure including:
      a deformable base, and
      a structural fascia formed on or attached to the deformable base;
   the deformable base configured for deformation from a button-press of the structural fascia;
   the structural fascia slotted to control deformation pressure for deformation of the deformable base, with alternating sections that are respectively relatively-thinner and relatively-thicker.

8. The device of claim 7, wherein the respective edge panel, and the touch button structure, including an outer surface of the structural fascia, are curved.

9. The device of claim 7, wherein the respective edge panel, and the touch button structure, including an outer surface of the structural fascia, are flat.

10. The device of claim 7, wherein button-press detection is based on one of inductive and capacitive sensing of deformation of the deformable base.

11. The device of claim 7, wherein the touch button structure is configured for a defined button-press deformation based on a defined touch-button length, a defined deformability of the deformable base, and a defined slotting difference between the relatively-thinner sections and the relatively-thicker sections.

12. A method of providing touch input for a device, comprising:

defining a touch button area, with a touch-button length, on an edge panel of the device;

configuring the touch button area of the edge panel with a touch button structure, including a deformable base, and a structural fascia formed on or attached to the deformable base, the deformable base configured for deformation from a button-press of the structural fascia;

slotting the structural fascia with alternating sections that are respectively relatively-thinner and relatively-thicker to control deformation pressure of the deformable base.

13. The method of claim 12, wherein the device is one of a personal communications device and a personal computing device.

14. The method of claim 12, wherein the edge panel, and the touch button structure, including an outer surface of the structural fascia, are curved.

15. The method of claim 12, wherein the edge panel, and the touch button structure, including an outer surface of the structural fascia, are flat.

16. The method of claim 12, wherein button-press detection is based on one of inductive and capacitive sensing of deformation of the deformable base.

17. The method of claim 12, wherein the touch button structure is configured for a defined button-press deformation based on a defined touch-button length, a defined deformability of the deformable base, and a defined slotting difference between the relatively-thinner sections and the relatively-thicker sections.

* * * * *